United States Patent [19]

Drake et al.

[11] 4,277,120
[45] Jul. 7, 1981

[54] PRINTED CIRCUIT BOARD STORAGE CABINET

[76] Inventors: Leo O. Drake, Ridge La., Mill Neck, N.Y. 11765; Randall S. Drake, 85A Old Oak La., Levittown, N.Y. 11756

[21] Appl. No.: 42,867

[22] Filed: May 29, 1979

[51] Int. Cl.³ .......................... H02B 1/02; H05K 7/14; A47B 88/00
[52] U.S. Cl. .................................. 312/320; 312/111; 312/350; 361/399; 361/415
[58] Field of Search ............... 312/320, 350, 108, 111; 361/415, 399

[56] References Cited

U.S. PATENT DOCUMENTS

| | | | |
|---|---|---|---|
| 3,052,821 | 9/1962 | Scoville | 361/399 |
| 3,382,476 | 5/1968 | Novet | 361/415 |
| 3,723,823 | 3/1973 | Lit et al. | 361/415 |
| 3,838,777 | 10/1974 | Thornicroft et al. | 361/415 |
| 3,950,057 | 4/1976 | Calabro | 361/415 |
| 4,002,381 | 1/1977 | Wagner et al. | 312/320 |
| 4,022,326 | 5/1977 | Marconi | 361/399 |
| 4,075,683 | 2/1978 | Johansson et al. | 361/415 |
| 4,076,353 | 2/1978 | Barlow | 312/350 |
| 4,091,440 | 5/1978 | Gelin et al. | 361/399 |
| 4,164,362 | 8/1979 | Cobaugh et al. | 361/415 |

*Primary Examiner*—Victor N. Sakran
*Attorney, Agent, or Firm*—Bauer & Amer

[57] ABSTRACT

A printed circuit board storage cabinet provides for guided retention of circuit boards between interengaged modular retaining members which are readily interchangeable to enable simultaneous storage of circuit boards having differing widths and which provide enhanced structural rigidity of the storage cabinet.

2 Claims, 6 Drawing Figures

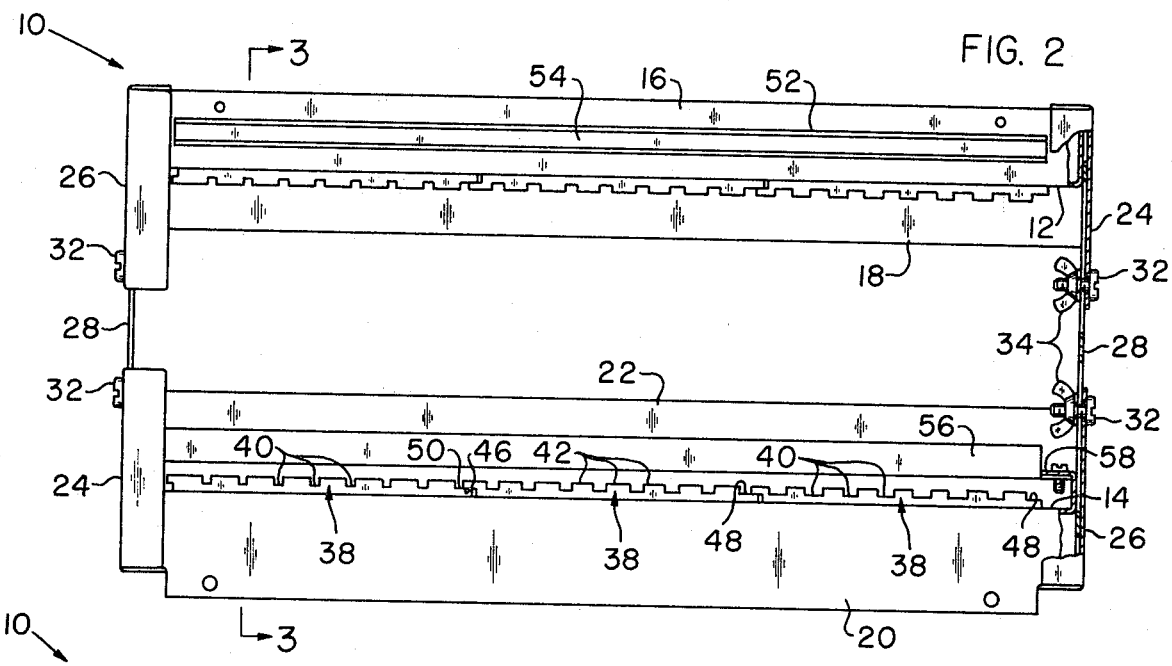
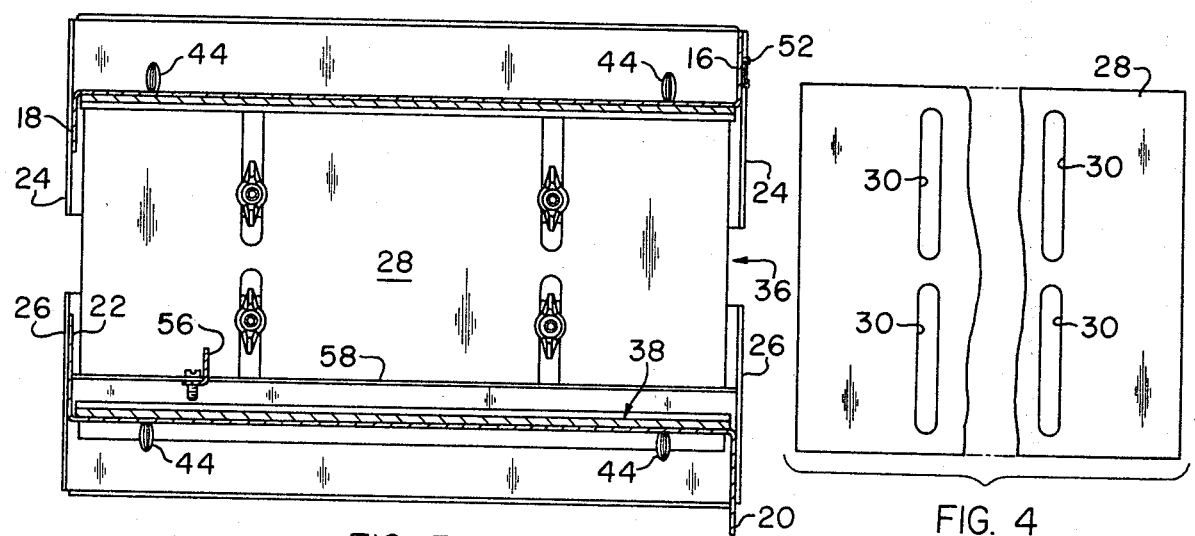
FIG. 3
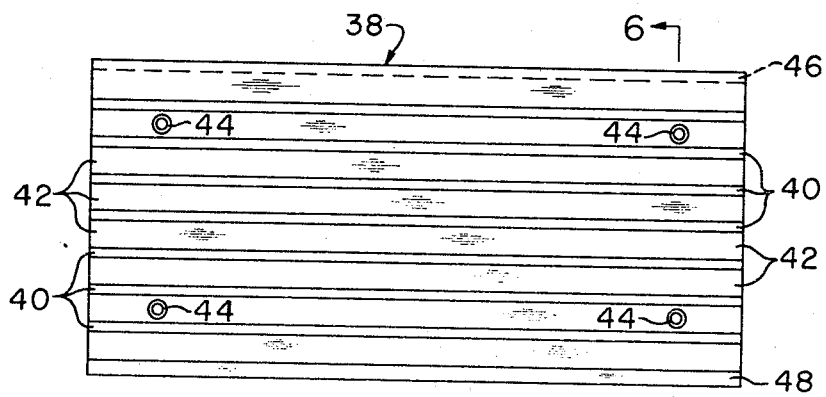
FIG. 5
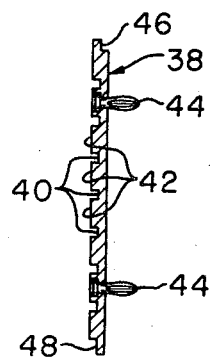
FIG. 4
FIG. 6

PRINTED CIRCUIT BOARD STORAGE CABINET

BACKGROUND OF THE INVENTION

The present invention relates to devices for retaining a plurality of printed circuit boards. More particularly, the invention relates to cabinets intended for the storage of spare or currently unused printed circuit boards.

Apparatus for operatively accommodating printed circuit boards or cards wherein connectors into which the boards are plugged are provided on the apparatus for completing electrical connections with electronic components on the boards are well known. Such apparatus is most commonly configured in the form of open racks or cages which include relatively complex edge receiving guides for accurately guiding the printed circuit boards into engagement with their corresponding electrical connectors and for positively retaining the boards against inadvertent dislodgment without gripping the same too tightly or in a manner susceptible of causing damage to the board or to its electrical circuits or components.

Often, the use of open rack-like cages for operatively accommodating printed circuit boards is dictated by the application—i.e. to assure sufficient ventilation and air circulation about the circuit boards to adequately dissipate heat produced by the electronic components mounted thereon. Of course, open cage-type arrangements of this sort provide little overall structural rigidity and strength of the housing and accordingly afford only minimum physical protection to the often complex and expensive printed circuit boards held therein. However, the use of substantially closed—and consequently more protective—cabinets under operating circumstances or conditions could result in an accumulation within the enclosure of an amount of heat sufficient to damage the components or at least adversely affect the operation of the electronic circuits. Hence, the use of protectively enclosing cabinets for powered or operating circuit boards is generally avoided.

On the other hand, it is often necessary to maintain on hand a relatively large quantity of spare printed circuit boards not currently used but which might subsequently be required for replacement of boards then in operation. In accommodating a readily accessible supply of replacement circuit boards, structures similar to those previously described have often been employed since the same are most easily available. But such structures, designed specifically for operative retention of printed circuit boards, suffer from a variety of defficiencies when utilized for non-operative storage of the circuit boards.

The lack of structural strength inherent in the constructural arrangement of an open rack or cage presents a substantiall drawback in that when relatively large numbers of spare printed circuit boards must be kept accessibly on hand multiple stacking of storage units is preferred so as to most efficiently utilize the storage space available. Stacking of the open cage-like racks might, however, result in damage to the racks and to at least some of the printed circuit boards, and a less efficient use of available space becomes necessary.

Moreover, the relatively complex configuration of the printed circuit board retaining guides, which are arranged to grip the boards against inadvertent dislodgment from engagement with the corresponding electrical connectors, are not designed for the continued or repeated insertion and removal of circuit boards common in a storage environment and, should the edge receiving channels or members become distorted or deformed with repeated use, the same could cause damage to the stored boards. In addition, the printed circuit board retaining guides, being intended for precision gripping and retention, are relatively expensive to fabricate and, as a consequence, the overall structures in which the same are provided are themselves excessively expensive for use in nonoperative storage applications.

Another drawback relates to the storage of printed circuit boards of varying thicknesses. Known devices for operatively or otherwise retaining printed circuit boards do not include provision for enabling storage in the same device of boards of differing thicknesses—at least not without disassembly of the unit and substitution of individual edge-receiving channels as required. Since in the storage of printed circuit boards for replacement purposes there is often a relatively rapid turnover of circuit boards and a consequent variation in the kinds and dimensions of those accommodated, it is preferable to enable the simultaneous accommodation of circuit boards having widely differing thicknesses in a single storage unit while retaining each of the boards in an edge-receiving channel substantially conforming in width to the thickness of the board.

It is, therefore, the desideratum of the present invention to provide a device for storing spare printed circuit boards which overcomes the disadvantages of structures currently utilized. In particular, it is an object of the invention to provide a printed circuit board storage cabinet having sufficient structural strength to enable stacking of multiple units and the ability to simultaneously accommodate printed circuit boards of differing board thicknesses.

It is a further object to provide a printed circuit board storage cabinet which includes provision for facilitated interchange of guide surfaces intended to retain and accommodate printed circuit boards of differing board thicknesses.

Further objects, features and advantages of the present invention will be more fully appreciated by reference to the following detailed description of a presently preferred, but nonetheless illustrative embodiment in accordance with the present invention when taken in conjunction with the accompanying drawings, wherein:

FIG. 2 is a front view, partially broken away, of the storage cabinet of FIG. 1;

FIG. 3 is a view of the storage cabinet taken along the lines 3—3 in FIG. 2;

FIG. 4 is a sectional plan view of the adjustment plate of the storage cabinet;

FIG. 5 is a plan view of a circuit board retaining and guide member of the present invention; and FIG. 6 is a view of the retaining and guide member taken along the lines 6—6 in FIG. 5.

DETAILED DESCRIPTION OF A PREFERRED EMBODIMENT

Figure 1:
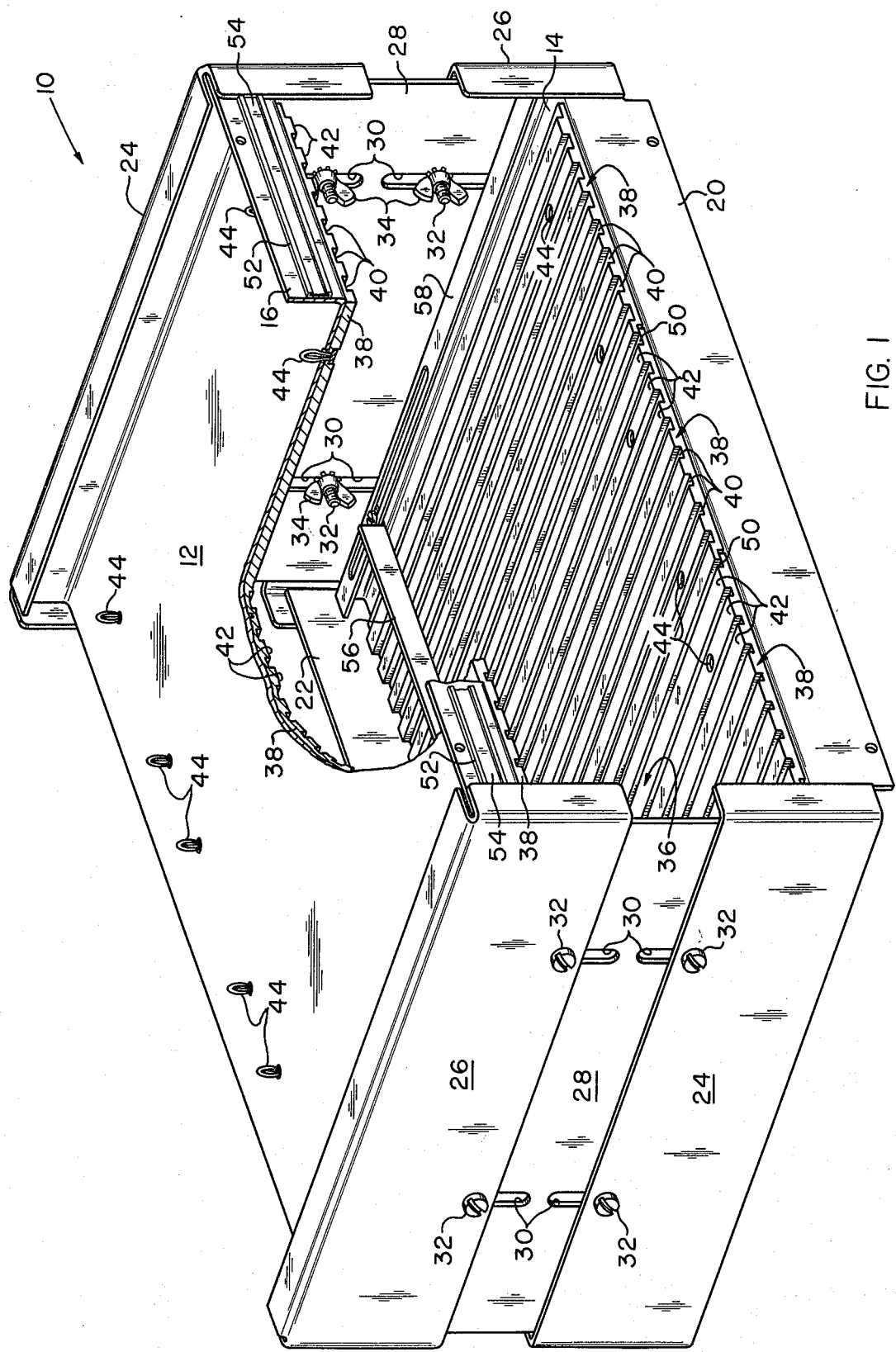
FIG. 1 is an elevated perspective view, partially broken away, of a circuit board storage cabinet in accordance with the present invention.

An embodiment of a storage device demonstrating objects and features of the present invention is shown in the drawings. There is more particularly seen in FIG. 1 a printed circuit board storage cabinet designated by the general reference numeral 10 and including a pair of substantially parallel and opposingly spaced apart support members 12, 14 between which circuit boards or cards may be accommodated in a manner hereinafter described. The upper support member 12 and the oppositely-disposed lower member 14 are each formed as substantially flat, plate-like members and are devoid of independent reinforcing or strengthening elements or structures secured thereto along their relatively flat support or major surfaces.

However, it will be noted that the upper support 12 has its respective forward and rearward edge portions 16, 18 oppositely bent or turned so as to dispose each such edge portion substantially perpendicular to the member 12. The same is true of the front and rear-disposed edge portions 20, 22 of the lower support member 14 which are similarly turned or bent. As perhaps best seen in FIG. 2, each of the forward edge portions 16, 20 of the respective support members 12, 14 are bent away from the oppositely disposed member and from each other while the rear edge portions 18, 22 are turned toward each other. In any event it should be understood that although the bending or turning of these edge portions may be effective to strengthen or reinforce to a limited extent the overall rigidity of the parallel and opposed surfaces 12, 14, the desirability of which will subsequently become evident, the relative stiffness and predisposition against deformation of the support members 12, 14 does not depend on or primarily result from the provision of these bent or flanged edge portions.

Each of the support members 12, 14 carries and supports a pair of sidewalls 24, 26 substantially normally depending from its opposite ends and extending in the direction of the respectively opposed support member. Each sidewalls 24, 26 on one of the support members 12, 14 is identically configured and arranged for cooperative engagement with a mutually oppositely disposed one of the sidewalls on the other of the support members. Thus, the sidewall 24 of the upper support member 12 is arranged for engagement with the sidewall 26 of the lower support member 14, while the sidewall 26 of the upper member 12 is oppositely disposed from the sidewall 24 of the lower member 14 for mutual engagement therewith.

An adjustable means comprising a substantially flat adjustment plate 28 is provided between each of the mutually oppositely disposed sidewalls 24, 26 for connecting the same and for enabling the adjustable selection of the spacing between the opposed support members 12, 14. In other words, the adjustable means 28 is arranged to provide the ability of continuously vary the spacing between the opposed members 12, 14 from a minimum to a maximum position and selectively therebetween while insuring that throughout the adjustment range the support members 12, 14 are maintained in substantial alignment for supported retention of printed circuit boards.

As seen in FIG. 4, each adjustment plate 28 includes a plurality of parallel elongated slots 30 defined through the plate to provide for an adjustable connection with the sidewalls 24, 26. For this purpose, each sidewall includes plural throughbores, each located for cooperative alignment with a corresponding one of the slots 30 on the adjustment plate 28 so as to theretogether define an alignment passageway for each bore and slot pair.

A screw 32 journalled through each said alignment passageway completes the connection between each of the adjustment plates 28 and the cooperating sidewalls 24, 26. A hand-rotatable wing nut 34 is threaded on each screw 32 for retention of the screws 32 in their respective passageways and the wing nuts can be tightened on their respective screws so as to constitute a locking means for maintaining a selected adjustment of the spacing between the opposed support members 12, 14. Thus, a loosening rotation of at least some of the wing nuts 34 relative to their cooperatively-engaged screws 32 enables relative movement of the mutually oppositely disposed sidewalls 24, 26 as the screws ride along their respective slots 30. In this manner the spacing between the opposed support members 12, 14 is selectively adjustable to a predetermined height or position which may be thereafter retained merely by a retightening or counter-rotation of the wing nuts 34 on and relative to the cooperating screws 32.

It should be readily apparent that the structural arrangement above-described and best seen in FIGS. 1 and 2 defines an essentially symmetric tubular or tunnel-like enclosure bounded by the opposed support members 12, 14 and the sidewalls 24, 26 adjustably connected by the plates 28. The enclosure includes a frontal opening generally designated 36 through which it is intended that printed circuit boards may be inserted for supported accommodation within the cabinet 10. While the opposite or rearward end of the enclosure is also seen to be substantially open, access to the interior of the cabinet from its back or rear is not necessary to its use and it is accordingly contemplated that the rearwardly-disposed end may be fully or partially closed, as for example with a covering plate or the like (not shown).

Hence, the provision of the rear flanges 18, 22 on the respective support members 12, 14, which flanges are seen more particularly in FIG. 2 to partially obstruct or close the rear opening of the enclosure, do not in any way interfere with the utility or intended applications of the cabinet 10. In fact, as will hereinafter be better understood, the partial closure of the rearwardly disposed end of the cabinet 10 by the flanges 18, 22 advantageously insures against an inadvertent overinsertion of a printed circuit board into the cabinet whereby the circuit board inserted through the frontal opening 36 might inadvertently be forced or otherwise moved through and out of the enclosure at its back or rearwardly-disposed open end.

It is intended that printed circuit boards accommodated for storage within the cabinet 10 be retained substantially normally between the parallel and opposingly spaced support members 12, 14, and consequently substantially parallel to the sidewalls 24, 26 and connecting adjustment plates 28. To effect this supported relation of printed circuit boards, a plurality of circuit board guide or retaining members individually and collectively designated 38 are supported or carried on the interior-defined surface of each of the support members 12, 14. Thus, the retaining members 38 are oppositely and facingly disposed within the interior of the cabinet 10 along the upper and lower support surfaces 12, 14.

It is preferred that each of the members 12, 14 support several of the retaining plates 38 and the drawing accordingly illustrates three such plates carried on each of the support members. It is, on the other hand, fully within the scope and contemplation of the invention to provide only a single retaining plate 38 on each support member 12, 14. In any event despite differences in the sizing of or spacing between certain of the constructional elements comprising each of the retaining plates 38, the general arrangement of each of the individual plates 38 is otherwise identical and hence the following description thereof is applicable to any single retaining plate 38 carried on either of the support members 12, 14 whether the member carries only one, or several, plates 38 thereon.

As seen in FIGS. 5 and 6, each of the circuit board retaining members or plates 38 is substantially flat and planar and includes a plurality of parallel grooves or channels 40 continuously defined between opposite edges of the plate 38. Each of the grooves 40 is of substantially uniform width along its length and it is intended that the width of all of the grooves on a retaining plate 38 be the same. Adjacently disposed ones of the grooves 40 separate relatively upstanding lands 42 which, like the grooves, extend fully and continuously between the opposite edges of the retaining member. When mounted on or secured to the support surfaces or members 12, 14, as hereinafter described, the orientation of the retaining plates 38 is such that the grooves or channels 40 are disposed parallel to the sidewalls 24, 26 and extend continuously from the cabinet's frontal opening 36 to its rearwardly-disposed or back end.

Each of the grooves or channels 40 constitutes one-half of a printed circuit board or card guide for slidably receiving an edge of a circuit board. Thus, the edges of a circuit board inserted into the cabinet 10 through its frontal opening 36 are slidably received in and guided along a pair of mutually oppositely disposed and facing grooves 40 of opposed retaining plates 38 carried on the respective support members 12, 14. It will accordingly be recognized that each mutually opposed pair of grooves or channels 40 accommodating the edges of a circuit board must be disposed in relative alignment so as to retain the circuit board substantially normally between the support members 12, 14. Moreover, this alignment must be maintained at all times irrespective of the selectively variable spacing between the opposed support members 12, 14.

Thus, corresponding pairs of oppositely positioned or disposed edge receiving channels or grooves 40 of the retaining members 38, carried on the respective parallel opposed members 12, 14, are appropriately aligned to enable the support of printed circuit boards between the support members 12, 14 and within the respectively opposed and aligned grooves 40. Printed circuit boards are upstandingly held in the storage cabinet 10 substantially perpendicularly between the opposed surfaces 12, 14 such that the edges of the circuit boards are supported in the grooves 40 and confined between the lands 42 to prevent lateral movement of the circuit boards out of the grooves 40. The printed circuit boards so accommodated are maintained essentially parallel and spaced from one another, by an amount substantially equal to the spacing between adjacent ones of the grooves 40, so as to prevent possibly deleterious or damaging contact between adjacently stored circuit boards as the same are inserted into or removed from within the storage cabinet 10.

As a consequence, the width of the lands 42 may be predeterminately defined for accommodating, in adequately spaced relation, particular circuit boards intended for storage in the cabinet 10. Put another way, where the printed circuit boards which the cabinet 10 is regularly meant to accommodate carry relatively large or bulky electronic components, retaining members or plates 38 fabricated with suitably width-wise dimensioned or enlarged lands 42 separating adjacent grooves 40 may be provided so as to make the most efficient use of the interior storage space available.

Similarly, it is intended that the width of the edge receiving channels or grooves 40 of the retaining plates 38 be slightly greater than the thickness of typical printed circuit boards to be stored in the cabinet 10. By substantially conforming the width of the grooves 40 to the thickness of the circuit boards retained therein, the probability of possibly damaging lateral movement of a retained circuit board or of contact with an adjacently-disposed board is minimized and the most efficient use of the interior storage space available is assured.

It is accordingly preferred that the storage cabinet 10 provide for facilitated removable securement of the circuit board retaining plates 38 on the opposed supporting members 12, 14. Detachable securement permits convenient interchangeability and substitution of multiple ones of the retaining plates 30 having grooves or channels 40 and lands 42 of differing widths for accommodating variously-dimensioned circuit boards. Any convenient securing means may be utilized with the retaining plates 38 for engagement with the support members 12, 14, and it is not intended that the practice of the invention be restricted to any particular securing structure.

By way of example, the drawings illustrate the use of plug-like members or flanges 44 which may be formed or otherwise provided integrally with the retaining plates 38. Each plug 44 is seen to project substantially normally out of the plane of the plate 38 for receipt in an appropriately positioned opening defined in the support members 12, 14. As perhaps best seen in FIG. 6, each plug 44 is of the type commonly known as banana plugs and includes an extended portion having a radial diameter larger than the diameter of the opening in the support member within which the plug is received. This enlarged portion is resiliently flexible so that the same will radially inwardly contract during insertion of the plug 44 into the corresponding support member opening, and then radially outwardly expand following said insertion to return the extended portion to its original or normal diameter. In like manner, the plug 44 will radially inwardly contract as the retaining plate 38 is lifted relative to the supporting member 12 or 14 so as to remove the plate from its supported position within the cabinet 10. It will, therefore, be appreciated that the use of radially contractable and expandible plug-like members 44 permits ready interchangeability of one retaining plate 38 for another without necessitating a disassembly of any portion of the storage cabinet 10.

It is, of course, recognized that in utilizing a printed circuit board storage cabinet it is often necessary to simultaneously accommodate circuit boards of various board thicknesses or plural boards laterally between which differing spacings are required. As a consequence, the cabinet 10 of the present invention is arranged to simultaneously accommodate differently-dimensioned circuit boards. More particularly, means are provided on each of the retaining plates 38 for interlocking or interengaging adjacently positioned ones of the retaining plates 38 so that the width of the edge-receiving grooves or channels 40, and of the lands 42, need not be the same for all retaining plates simultaneously supported on the members 12, 14.

This arrangement is best seen in FIGS. 1 and 2, wherein the width of the edge-receiving channels 40 of the retaining plates 38 increases from plate to plate as one moves from the left hand to the right hand end of the cabinet 10. The juxtaposed interengagement of adjacent retaining plates 38 is accomplished, as detailed in FIG. 6, by providing each of the plates with an undercut or overhang designated 46 along an edge parallel with the grooves 40 and an open shelf or foot 48 along the opposite edge of the retaining plate. The height of the undercut 46 and the depth of the foot 48 are substantially equal so that, again referring to FIGS. 1 and 2, the foot 48 of one retaining plate 38 interengages under and contiguously against the undercut 46 of the adjacently positioned retaining plate so as to form or define an inter-plate edge receiving channel 50.

This structural arrangement enables any retaining plate 38 to interlock or interengage with any other adjacently positioned retaining plate regardless of the difference in their groove widths. Moreover, although each support member 12, 14 carries on its interior face or surface a plurality of interengaged retaining members 38, the adjacently positioned and interlocked plates functionally guide and retain printed circuit boards as though the full extent of the surface of each support member 12, 14 is covered by a single, integral and unitary retaining member 38. Thus, the above-described sectional or modular use of adjacently interengaged retaining plates 38 advantageously facilitates simultaneous support of circuit boards of differing thicknesses without waste of the available interior storage space between adjacent retaining members.

In order to permit ready identification by a user of the storage cabinet 10 of the range of circuit board thicknesses storable within the cabinet by virtue of the provision of the modular interengaged retaining plates 38, an elongated identification strip-mount 52 may be adhesively or otherwise secured on the outwardly-facing surface of the upper forward flange 16. Preprinted or user-defined label strips 54 may be inserted into the identification guides 52 for identifying the printed circuit boards stored in various portions of the cabinet or for indicating the groove widths provided for such storage.

A restraining or stop means may be provided cooperatively on the lower or bottom support member 14 to adjustably stop the inwardly directed movement of printed circuit boards inserted into the cabinet 10 through its frontal opening 36 at a selected position within the enclosure. Where all of the circuit boards to be stored in the cabinet 10 are of substantially the same length, the adjustability of the stop means permits the alignment of the outwardly facing edges of the boards so as to present a neat and attractive appearance.

The stop means comprises an elongated restraining bar 56 which may be L-shaped as shown or otherwise conveniently configured in any manner desired. The bar 56 extends for substantially the entire length of the printed circuit board storage cabinet 10 and may be releasably connected as by screws or the like to an adjustment track means 58 along which the bar 56 is relatively slidable for adjustment of the depth to which printed circuit boards may be inserted into the cabinet 10. The track means 58 may be carried on the lower support member 14 and raised therefrom as shown in the drawings or the same may alternatively depend from the upper member 12 or from the depending sidewalls 24, 26. The restraining bar 56 may also be stepped (not shown) rather than straight so as to enable the storage of printed circuit boards of varying lengths whereby the outwardly facing edges of the boards can be adjustably aligned proximate the cabinet's frontal opening 36.

It is preferred that the storage cabinet 10 be structurally arranged to enable a plurality of such cabinets to be stacked one atop another. It is intended that the upper and lower forward flanges 16, 20, respectively, facilitate a stacked alignment of multiple storage units. In any event those skilled in the art will recognize that as the cabinets 10 are stacked one atop another, the upper and lower support members 12, 14 will be vulnerable to bending or deformation as a result of the significant weight-induced forces acting thereon. Since no independent reinforcing or strengthening elements or structures, such as ribbing or the like, are apparent along the substantially flat extents of the support members 12, 14, it would seem as though the same would be particularly susceptible and vulnerable to such bending and associated deformation, with consequent damage to the circuit boards stored therebetween.

However, the retaining members 38 detachably secured to and carried on the support members 12, 14 are effective to reinforce and strengthen the same against deformation. The interengaged modular or sectional retaining plates 38 on each of the support members 12, 14 stiffen and reinforce the respective support surfaces to an extent exceeding that which would result from the provision of only a single retaining plate 38 on each support member. As understood, this enhanced rigidity results because each of the width-wise smaller modular retaining plates 38 is itself less bendable or deformable than a single larger plate would be. In addition, the interlocking or interengagement of the adjacent plates substantially frustrates relative bending movement between adjacently disposed plates 38. As a consequence, the provision of a plurality of adjacently-interengaged modular retaining plates 38 carried along substantially the full extent of each support member 12, 14 permits multiple storage cabinets 10 to be safely stacked one atop another without risking damage to the stored printed circuit boards and thereby enables a maximally efficient use of the storage area available.

The present invention, therefore, teaches a storage cabinet for printed circuit boards and the like wherein the circuit boards are retained between readily secured and interchangeable guide plates and the storage cabinets are advantageously and safely stackable one atop the other. The provision of adjacently positioned and interengaged modular circuit board retaining plates enables the simultaneous storage in a single cabinet of printed circuit boards having different widths and furthermore provides structural reinforcement of the storage cabinet support members.

It should be understood and appreciated that the precise configuration of the major structural elements of the storage cabinet are not critical to the practice of the invention which is deemed to lie in the modular use and configuration of the printed circuit board retaining members. These members or plates contain edge-receiving channels or grooves which run continuously and unbrokenly between opposite edges of the plates. This insures that as a circuit board is inserted into the storage cabinet the same is positively guided along its retaining track so as to prevent slanted insertion which might result in inadvertent contact with and damage to an adjacently disposed circuit board.

While there have been shown and described and pointed out the fundamental novel features of the invention as applied to a preferred embodiment thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

What is claimed is:

1. A retaining and storage device for printed circuit boards comprising:

a pair of substantially parallel and opposingly spaced surfaced support members for accommodating a plurality of printed circuit boards substantially normally therebetween, a pair of sidewalls substantially perpendicularly depending from and connecting opposite ends of said support members so as to define an enclosure bounded by said opposed support members and said connecting sidewalls and having a frontal opening for enabling insertion of printed circuit boards into said enclosure, printed circuit board retaining means for detachable securement on each of said support members in the interior of said enclosure and comprising plural retaining plates, each of said plates being substantially flat and planar and including a plurality of parallel grooves of a predetermined width defined therein and extending uninterruptedly between opposite edges of said plate for supportedly receiving in said grooves edges of printed circuit boards which substantially conform in thickness to the predetermined width of said grooves, and means on each said plate for interlocking adjacently disposed ones of said plates so as to form a substantially continuous and unbroken planar surface of a plurality of said adjacently disposed plates as though the same were unitarily formed, the plurality of grooves of one of said plates being capable of being of a predetermined width different from that of the grooves of others of said plates, and means for detachable engagement of said plural plates on said opposed surfaces of said support members to strengthen and rigidify the same and so that said grooves extend from said frontal opening into the interior of said enclosure for receiving and guiding printed circuit boards inserted into said device through the frontal opening and for supporting the printed circuit boards in said grooves substantially parallel to said sidewalls and perpendicularly between said opposed support members, the provision of said plural interlocked retaining plates engaged by said detachable engaging means in planar surface to surface engagement with said surface of each of said support members connects and joins said planar surfaces together into an integral unitary surface by which said planar surfaces add to said surfaces of such support members to reinforce and rigidify the same, said detachable engagement means comprises plug means integral with and projecting out of the plane of said plates for receipt in openings correspondingly defined in said support member surfaces and include radially flexible resilient elongated fingers each having a normal diameter along at least a portion of its length larger than the diameter of said support member openings, each of said fingers being radially inwardly contractable during insertion of the finger into the corresponding support member opening and radially outwardly expandable to return the same to its normal diameter following said insertion into the corresponding opening.

2. A retaining and storage device for printed circuit boards according to claim 1 wherein the predetermined width of said grooves defined in at least one of the plural retaining plates on each said support member differs from the predetermined width of the grooves in the others of said plates on the support member so as to enable printed circuit boards of different thicknesses to be simultaneously accommodated in said device.

* * * * *